US008378374B2

(12) United States Patent
Loh et al.

(10) Patent No.: US 8,378,374 B2
(45) Date of Patent: Feb. 19, 2013

(54) SEMICONDUCTOR LIGHT EMITTING DEVICE PACKAGES INCLUDING SUBMOUNTS

(75) Inventors: Ban P. Loh, Durham, NC (US); Nicholas Medendorp, Jr., Raleigh, NC (US); Bernd Keller, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/685,883

(22) Filed: Jan. 12, 2010

(65) Prior Publication Data

US 2010/0109029 A1   May 6, 2010

Related U.S. Application Data

(62) Division of application No. 11/412,381, filed on Apr. 27, 2006, now Pat. No. 7,655,957.

(51) Int. Cl.
*H01L 33/62* (2010.01)
*H01L 33/64* (2010.01)

(52) U.S. Cl. ... 257/99; 257/675; 257/676; 257/E33.058; 257/E33.075

(58) Field of Classification Search ............... 257/88, 257/98–100, 675, 676, 93, 91, 706, 720, 257/725, E33.058, E33.075; 313/500, 505
See application file for complete search history.

(56) References Cited

U.S. PATENT DOCUMENTS

| 6,274,924 | B1 | 8/2001 | Carey et al. |
| 6,376,902 | B1 | 4/2002 | Arndt |
| 6,469,321 | B2 | 10/2002 | Arndt |
| 6,573,580 | B2 | 6/2003 | Arndt |
| 6,716,673 | B2 | 4/2004 | Waitl et al. |
| 7,244,965 | B2 | 7/2007 | Andrews et al. ............... 257/98 |
| 7,321,161 | B2 * | 1/2008 | Teixeira et al. ............ 257/675 |
| 2002/0149312 | A1 * | 10/2002 | Roberts et al. ............... 313/495 |

(Continued)

FOREIGN PATENT DOCUMENTS

| CN | 1560672 A | 1/2005 |
| CN | 1612369 A | 5/2005 |

(Continued)

OTHER PUBLICATIONS

Luxeon Technical Datasheet DS23, "Power Light Source LUXEON Star" 19 pages (Mar. 2006).

(Continued)

*Primary Examiner* — Kenneth Parker
*Assistant Examiner* — Yu Chen
(74) *Attorney, Agent, or Firm* — Myers Bigel Sibley & Sajovec, PA

(57) ABSTRACT

A submount for a solid state lighting package includes a support member having upper and lower surfaces, a first side surface, and a second side surface opposite the first side surface, a first electrical bondpad on the upper surface of the support member and having a first bonding region proximate the first side surface of the support member and a second bonding region extending toward the second side surface of the support member, and a second electrical bondpad on the upper surface of the support member having a die mounting region proximate the first side surface of the support member and an extension region extending toward the second side surface of the support member. The die mounting region of the second electrical bondpad may be configured to receive an electronic device. The submount further includes a third electrical bondpad on the upper surface of the support member and positioned between the second side surface of the support member and the die mounting region of the second electrical bondpad.

10 Claims, 2 Drawing Sheets

U.S. PATENT DOCUMENTS

| | | | |
|---|---|---|---|
| 2002/0158261 A1 | 10/2002 | Lee et al. | |
| 2004/0041222 A1 | 3/2004 | Loh | |
| 2004/0079957 A1 | 4/2004 | Andrews et al. | |
| 2004/0126913 A1 | 7/2004 | Loh | |
| 2004/0188700 A1 | 9/2004 | Fukasawa et al. | |
| 2004/0208210 A1* | 10/2004 | Inoguchi | 372/36 |
| 2005/0059179 A1 | 3/2005 | Erchak et al. | |
| 2005/0127485 A1 | 6/2005 | Shei et al. | |
| 2005/0269587 A1 | 12/2005 | Loh et al. | |
| 2006/0163587 A1* | 7/2006 | Erchak et al. | 257/82 |
| 2007/0063321 A1 | 3/2007 | Han et al. | 257/675 |
| 2008/0023721 A1* | 1/2008 | Lee et al. | 257/99 |

FOREIGN PATENT DOCUMENTS

| | | |
|---|---|---|
| DE | 2 315 709 | 3/1973 |
| EP | 1 249 874 A2 | 10/2002 |
| EP | 1 249 876 A2 | 10/2002 |
| EP | 1 467 417 A2 | 10/2004 |
| JP | 4-283948 A | 10/1992 |
| JP | 6196759 | 7/1994 |
| JP | 2003031895 | 1/2003 |
| JP | 2004235611 | 8/2004 |

OTHER PUBLICATIONS

Technical Data DS08, "SnapLED 150" 6 pages (Oct. 11, 2004).
Invitation to Pay Additional Fees, with Communication Relating to the Results of the Partial International Search, PCT/US2007/007327, Aug. 22, 2007.
International Search Report and Written Opinion for PCT/US2007/007327; Nov. 19, 2007.
Written Opinion of the International Preliminary Examination Authority for PCT/US2007/007327; Jun. 19, 2008.
Communication pursuant to Article 94(3) EPC corresponding to European Application No. 07 753 914.6 dated Dec. 14, 2010; 6 Pages.
European Search Report Corresponding to European Application No. 11170753.5; Dated: Mar. 12, 2012; 8 Pages.

* cited by examiner

SEMICONDUCTOR LIGHT EMITTING DEVICE PACKAGES INCLUDING SUBMOUNTS

CLAIM OF PRIORITY

The present application is a divisional of and claims priority from U.S. application Ser. No. 11/412,381, filed Apr. 27, 2006 now U.S. Pat. No. 7,655,957, entitled "SUBMOUNTS FOR SEMICONDUCTOR LIGHT EMITTING DEVICE PACKAGES AND SEMICONDUCTOR LIGHT EMITTING DEVICE PACKAGES INCLUDING THE SAME," which is assigned to the assignee of the present application, the disclosure of which is hereby incorporated herein by reference as if set forth fully.

FIELD OF THE INVENTION

This invention relates to semiconductor light emitting devices, and more particularly to packages for semiconductor light emitting devices.

BACKGROUND

It is known to mount solid state light sources, such as semiconductor light emitting diodes, in packages that may provide protection, color selection, focusing and the like for light emitted by the light emitting device. A solid state light emitting device may be, for example, an organic or inorganic light emitting diode ("LED"). Some packages for light emitting diodes are described in U.S. Pre-grant Publication Nos. 2004/0079957, 2004/0126913, and 2005/0269587 which are assigned to the assignee of the present invention, and which are incorporated herein by reference as if set forth fully herein.

Packages as described in the above referenced publications may be suitable for high power, solid state illumination applications. However, notwithstanding the advances described therein, there remains a need for improved packages in which multiple LEDs may be mounted. In particular, in some general lighting applications it may be desirable for an LED package to include multiple LEDs emitting in different regions of the visible spectrum. Light emitted by the LEDs may combine to produce a desired intensity and/or color of light, such as white light or any other desired color. In that case, it may be desirable for the LEDs in the package to be mounted relatively closely together.

SUMMARY

Embodiments of the present invention provide a submount for a solid state lighting package including a support member having an upper surface, a first side surface, and a second side surface opposite the first side surface, a first electrical bondpad on the upper surface of the support member and having a first bonding region proximate the first side surface of the support member and a second bonding region extending toward the second side surface of the support member, and a second electrical bondpad on the upper surface of the support member having a die mounting region proximate the first side surface of the support member and an extension region extending from the die mounting region toward the second side surface of the support member. The die mounting region of the second electrical bondpad may be configured to receive an electronic device. The submount further includes a third electrical bondpad on the upper surface of the support member and positioned between the second side surface of the support member and the die mounting region of the second electrical bondpad.

The third electrical bondpad may further include a die mounting region and a wirebonding region. The extension region of the second electrical bondpad extends between the second bonding region of the first electrical bondpad and the die mounting region of the third electrical bondpad.

The first bonding region of the first electrical bondpad may be located closer to the first side surface of the support member than the second electrical bondpad. The second bonding region of the first electrical bondpad extends closer to the second side surface of the support member than the die mounting region of the second electrical bondpad.

The extension region of the second electrical bondpad may extend closer to the second side surface of the support member than the second bonding region of the first electrical bondpad.

The submount may further include a fourth electrical bondpad on the upper surface of the support member and having a first bonding region proximate the first side surface of the support member and a second bonding region extending toward the second side surface of the support member, and a fifth electrical bondpad on the upper surface of the support member having a die mounting region proximate the first side surface of the support member and an extension region extending toward the second side surface of the support member. The die mounting region of the fifth electrical bondpad may be configured to receive an electronic device. The submount may further include a sixth electrical bondpad on the upper surface of the support member and positioned between the second side surface of the support member and the die mounting region of the fifth electrical bondpad.

The sixth electrical bondpad may further include a die mounting region and a wirebonding region, and the extension region of the fifth electrical bondpad may extend between the second bonding region of the fourth electrical bondpad and the die mounting region of the sixth electrical bondpad. The first bonding region of the fourth electrical bondpad may be located closer to the first side surface of the support member than the fifth electrical bondpad.

The support member may include a thermally conductive, electrically insulating material. In particular embodiments, the support member may include SiC, AlN and/or diamond. The submount may further include a solderable metal layer on a lower surface of the support member.

The first and second electrical bondpads may be separated by a gap of no more than about 0.2 mm. In particular embodiments, the first and second electrical bondpads may be separated by a gap of about 0.1 mm. Similarly, the second and third electrical bondpads may be separated by a gap of no more than about 0.2 mm, and in particular embodiments by a gap of about 0.1 mm. The first, second and third electrical bondpads may include a layered metal stack including Ti, Ni and Au.

A package for a plurality of light emitting devices according to embodiments of the invention includes a body including an upper surface, and a submount on the upper surface of the body. The submount includes an upper surface, a first side surface, and a second side surface opposite the first side surface. A first electrical bondpad is on the upper surface of the submount and has a first bonding region proximate the first side surface of the submount and a second bonding region extending toward the second side surface of the submount. A second electrical bondpad is on the upper surface of the submount and has a die mounting region proximate the first side surface of the submount and an extension region extending from the die mounting region toward the second side surface of the submount. The die mounting region of the second electrical bondpad may be configured to receive an electronic device. The submount further includes a third electrical bondpad on the upper surface of the submount and positioned between the second side surface of the submount and the die mounting region of the second electrical bondpad.

The third electrical bondpad may further include a die mounting region and a wirebonding region.

The package may further include a first light emitting device mounted on the die mounting region of the second electrical bondpad, and a second light emitting device mounted on the third electrical bondpad. A first external lead is on a first side of the package and is electrically connected to the first light emitting device. A second external lead is on a second side of the package, opposite to the first side of the package, and is electrically connected to the extension region of the second electrical bondpad.

The package may further include a third external lead on the first side of the package and electrically connected to the first electrical bondpad, and a fourth external lead on the second side of the package and electrically connected to the third electrical bondpad.

The first and third external leads may include contacts of a first polarity type, and the second and fourth external leads may include contacts of a second polarity type, opposite the first polarity type.

The first external lead may be connected to the first light emitting device via a first wirebond connection, and the third external lead may be connected to the first electrical bondpad via a second wirebond connection. The second bonding region of the first electrical bondpad may be connected to the second light emitting diode via a third wirebond connection.

The second external lead may be connected to the extension region of the second electrical bondpad via a fourth wirebond connection, and the fourth external lead may be connected to the third electrical bondpad via a fifth wirebond connection.

The second bonding region of the first electrical bondpad may be connected to the second light emitting diode via a sixth wirebond connection.

The extension region of the second electrical bondpad may extend between the second bonding region of the first electrical bondpad and the die mounting region of the third electrical bondpad. The first bonding region of the first electrical bondpad may be located closer to the first side surface of the submount than the second electrical bondpad.

The second bonding region of the first electrical bondpad may extend closer to the second side surface of the submount than the die mounting region of the second electrical bondpad. The extension region of the second electrical bondpad may extend closer to the second side surface of the submount than the second bonding region of the first electrical bondpad.

The package may further include a fourth electrical bondpad on the upper surface of the submount and having a first bonding region proximate the first side surface of the submount and a second bonding region extending toward the second side surface of the submount, and a fifth electrical bondpad on the upper surface of the submount having a die mounting region proximate the first side surface of the submount and an extension region extending toward the second side surface of the submount. The die mounting region of the fifth electrical bondpad may be configured to receive an electronic device. The package may further include a sixth electrical bondpad on the upper surface of the submount and positioned between the second side surface of the submount and the die mounting region of the fifth electrical bondpad.

A package for a light emitting device according to some embodiments of the invention includes a package body including a first side surface and a second side surface opposite the first side surface and a central region exposing a plurality of die attach pads, a plurality of first electrical leads of a first polarity type extending from the first side surface of the molded body, and a plurality of second electrical leads of a second polarity type, opposite the first polarity type, extending from the second side surface of the molded body. Respective ones of the first electrical leads are electrically connected to corresponding ones of the plurality of die attach pads.

The package may further include a reflector cup surrounding the central region of the package body.

The package may further include a recess in the central region of the package body, the recess exposing at least portions of the plurality of first electrical leads. The recess may include a first recess, the package may further include a second recess in the central region of the package body, the second recess exposing at least portions of the plurality of second electrical leads.

The package may further include a plurality of wirebond connections between the first electrical leads and corresponding ones of the die attach pads. The package may further include a plurality of light emitting devices mounted on corresponding ones of the die attach pads, and a plurality of wirebond connections between the second electrical leads and corresponding ones of the light emitting devices. The plurality of light emitting devices are electrically isolated from one another.

The package body may be molded to a leadframe including the plurality of first leads and the plurality of second leads.

The package may further include a submount on the central region of the package body. The plurality of die attach pads may be provided on the submount.

The package body may include respective upper and lower surfaces, the package may further include a heatsink member within the central region and extending from the upper surface to the lower surface of the package body, and the submount may be in contact with the heatsink member.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
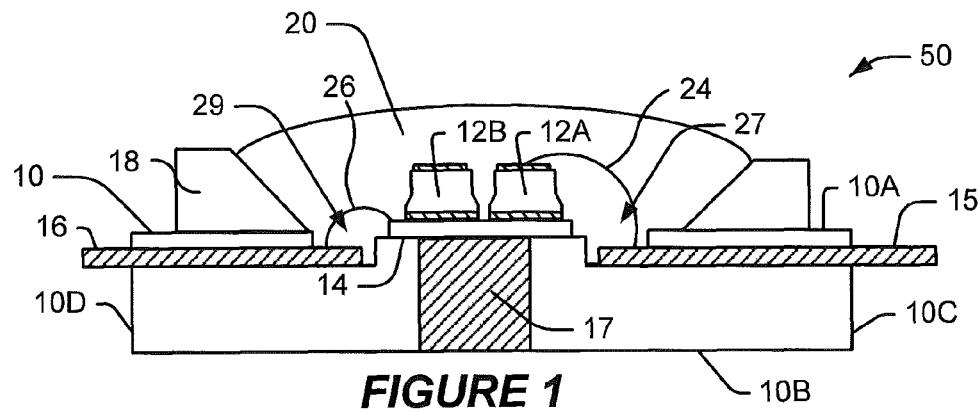
FIG. 1 is a cross-sectional side views illustrating a package for a plurality of light emitting devices according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As used herein, the term semiconductor light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes ("LEDs") may be provided. Red and/or amber LEDs may also be provided. The design and fabrication of semiconductor light emitting devices are well known to those having skill in the art and need not be described in detail herein.

For example, the semiconductor light emitting devices packaged in accordance with embodiments of the invention may be gallium nitride-based LEDs or lasers fabricated on a silicon carbide substrate such as those devices manufactured and sold by Cree, Inc. of Durham, N.C.

The LEDs and/or lasers may be configured to operate such that light emission occurs through the substrate in a so-called "flip chip" orientation.

Referring now to FIG. 1, a package 50 according to some embodiments of the invention is illustrated. The package 50 includes a body 10 having a top surface 10A including a central region on which a submount 14 is positioned. The body 10 may be formed from a nonconductive material such as plastic, ceramic, or the like. In some embodiments, the body 10 may include a conductive core and may be coated with a nonconductive coating, such as a polymer coating. In other embodiments, the body 10 may be formed from a printed circuit board (PCB), such as a standard FR-4 PCB and/or a metal core PCB.

A first external lead 15 extends from one side of the package 50. The first external lead 15 may extend into/onto the body 10 such that the first external lead 15 is at least partially provided on an upper surface 10A of the body 10. In the embodiments illustrated in FIG. 1, the first external lead 15 extends through the body 10 and into a recess 27 adjacent the submount 14. The first external lead 15 extends from a first side surface 10C of the body 10. A portion of the first external lead 15 is exposed within the recess 27. A second external lead 16 extends from a second side surface 10D of the package 50, opposite the first side surface 10C, and into a second recess 29 adjacent the submount 14. A portion of the second external lead 16 may be exposed within the second recess 29. It will be appreciated that the recesses 27, 29 are optional. Furthermore, it will be appreciated that the first and second leads 15, 16 may be formed on and/or affixed to the body 10 rather than extending through the body 10. It will be further understood that the first and second leads 15, 16 may or may not extend past the periphery of the body 10 and/or may wrap around or be formed on end portions of the body 10. In some embodiments, however, the body 10 may be formed around a leadframe including the first and second external leads, 15, 16, for example, by injection molding. The leadframe may further include a heatsink member 17, which may be provided within the central region of the body 10. The heatsink member 17 may extend through the body 10 from the top surface 10A to the bottom surface 10B. The heatsink member 17 may include a thermally conductive material such as copper.

A reflector cup 18 is positioned on the upper surface of the body 10. The reflector cup 18 may be formed integral with the body 10 and/or may be attached to the body 10 using glue, solder, or another suitable attachment technique. The reflector cup 18 generally surrounds the submount 14 and defines an optical cavity above a central region of the submount 14. The reflector cup 18 may include a metal ring, a plastic ring and/or a plastic ring coated with a reflective material. It will be appreciated that one or more lens elements (not shown) may be provided in the package in or above the optical cavity.

A pair of light emitting devices (LEDs) 12A, 12B are mounted on the submount 14. In the illustrated embodiments, the LEDs 12A, 12B are XBright® LED chips manufactured by Cree, Inc. including conductive SiC substrates. The LEDs 12A, 12B may be vertical devices including a cathode contact on one side the chip and an anode contact on an opposite side of the chip. In the embodiments illustrated in FIG. 1, the LEDs 12A, 12B are mounted in a flip-chip configuration, with the anode contacts arranged face down on the submount 14 and the cathode contacts arranged face up. In this configuration, light generated in the active regions of the LEDs 12A, 12B may be emitted upwards through their respective substrates and out of the chips. Light emitted sideways or downwards may be reflected by the submount 14 and/or the reflector 18.

As shown in FIG. 1, a first wirebond connection 24 may connect the first external lead 15 with a contact of the first LED 12A. Likewise, a second wirebond connection 26 may connect the second external lead 16 with a conductive trace on the submount 14. Additional LEDs may be provided on the submount 14, and/or additional wirebond connections may be included to electrically connect the LEDs with respective other external leads, as is explained in more detail below.

The LEDs 14 may be encapsulated using an optically clear encapsulant 20 such as silicone, epoxy resin or the like. The encapsulant 20 may include a wavelength conversion material, such as a phosphor, as is known to those skilled in the art. Other materials, such as dispersers and/or index matching materials may be included in the encapsulant.

Figure 2:
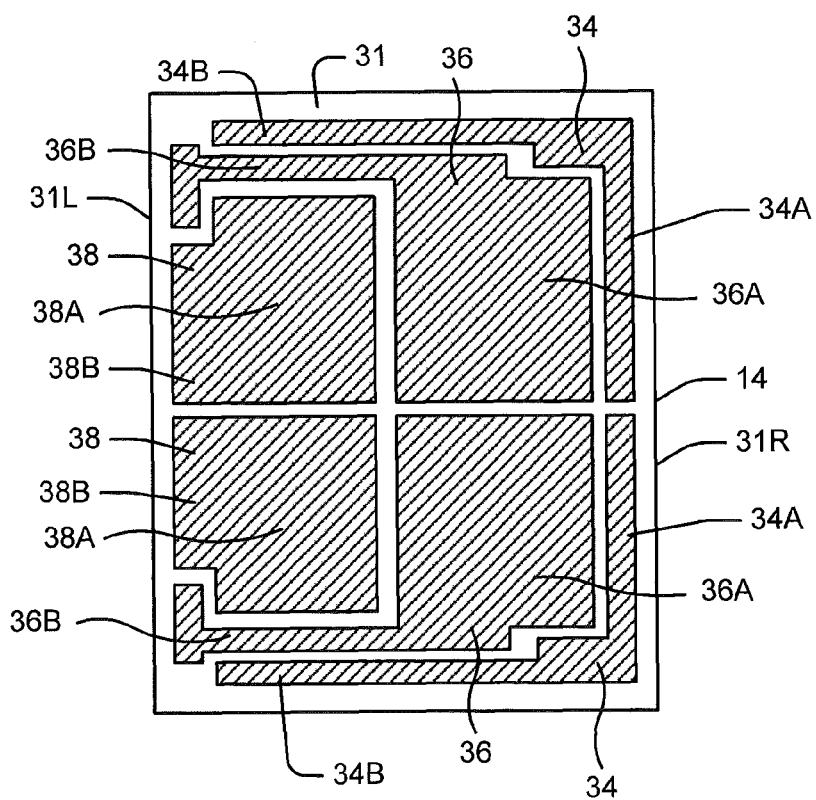
FIG. 2 is a top view of a submount for a package for a plurality of light emitting devices according to some embodiments of the invention.

FIG. 2 is a top view of a submount 14 for a package 50 for a plurality of light emitting devices according to some embodiments of the invention. According to embodiments of the invention, the submount 14 includes a support member 31, which may be a generally planar member having upper and lower planar surfaces. The support member 31 may be formed from a material that is not electrically conductive and/or may have an electrically non-conductive coating or layer on at least an upper surface thereof. The support member 31 may be thermally conductive, however, to allow for the efficient removal of heat from the LEDs mounted thereon. In particular embodiments, the support member 31 may include a thin layer of a dielectric material such as silicon carbide, aluminum nitride and/or industrial diamond. In particular embodiments, the support member 31 may have dimensions of about 3 mm×3 mm or less, and may be about 0.25 mm thick.

The upper and lower surfaces of the planar support member 31 may include metal traces formed thereon. In particular, the upper surface of the support member 31 may include finely patterned metal traces for die attach and/or wirebonding. Due to the small dimensions of the support member 31, such layers may be formed, for example, using techniques conventionally used for forming finely patterned metal layers on semiconductor devices, such as evaporation and liftoff techniques.

Referring to FIG. 2, the upper surface of the support member 31 of the submount 14 includes a pair of first metal traces 34, a pair of second metal traces 36 and a pair of third metal traces 38. It will be appreciated that in the embodiments illustrated in FIG. 2, the respective pairs of metal traces are provided as mirror images of one another. Thus, the following discussion will, for simplicity, generally refer only to one of the first, second and/or third metal traces 34, 36, 38. As shown in FIG. 2, the first metal trace 34 includes a first bonding region 34A proximate a first side 31R of the support member 31 and a second bonding region 34B that extends away from the first bonding region 34A towards a second side 31L of the support member that is opposite the first side 31R. The first bonding region 34A and the second bonding region 34B of the first metal trace 34 provide a pair of bondpads to which ball, wedge or other wirebonds may be formed.

The second metal trace 36 includes a die mounting region 36A that is generally proximate to the first side 31R of the support member 31. In the embodiments illustrated, the first bonding region 34A of the first metal trace 34 is between the die mounting region 36A of the second metal trace 36 and the first side 31R of the support member 31. However, it will be appreciated that in some embodiments, some portion of the die mounting region 36A may be positioned more closely to the first edge 31R of the support member than at least some portions of the first bonding region 34A.

The die mounting region 36A of the second metal trace 36 may be sized and configured such that a light emitting device such as an LED chip may be mounted thereon. The second metal trace 36 may further include an extension region 36B extending away from the die mounting region 36A toward the second side 31L of the support member 31. The extension region 36B may provide a bondpad to which a wirebond may be made.

The third metal trace 38 is positioned proximate the second side 31L of the support member 31 and may be sized and configured such that a light emitting device such as an LED chip may be mounted thereon. The third metal trace 38 may include both a die mounting region 38A and a wirebonding region 38B proximate the second side 31L of the support member 31. While the embodiments illustrated in FIG. 2 include a total of four die mounting regions 36A, 38A, arranged in a 2×2 array, it will be appreciated that submounts according to other embodiments of the invention may include more or fewer die mounting regions. For example, submounts according to some embodiments of the invention may include six die mounting regions arranged in a 2×3 array, nine die mounting regions arranged in a 3×3 array, etc.

In the embodiments illustrated in FIG. 2, the extension region 36B of the second metal trace 36 may extend between the second bonding region 34A of the first metal trace 34 and the die mounting region 38A of the third metal trace 38. However, it will be appreciated that other configurations are possible.

Furthermore, in some embodiments, the second bonding region 34B of the first electrical trace 34 may extend closer to the second side 31L of the support member than the die mounting region 36A of the second electrical trace 36. However, in some embodiments, the extension region 36B of the second metal trace 36 may extend closer to the second side 31L of the support member 31 than the second bonding region 34B of the first metal trace 34.

One or more of the first metal trace 34, second metal trace 36 and third metal trace 38 may include a layered metal stack suitable for wirebonding and/or mounting of LED chips. For example, the metal traces 34, 36, 38 may include a stack of titanium, nickel, platinum, copper and/or gold layered in order on the support member 31. In particular embodiments, the titanium layer, which may provide adhesion to the support member 31, may be formed to have a thickness of about 0.06 µm or greater. The nickel layer may be formed on the titanium layer and may have a thickness of about 25 µm or greater. The gold layer may be formed on the nickel layer and may have a thickness of about 0.6 µm or greater. As is known in the art, gold may provide a suitable surface for wirebonding and/or chip mounting. In further embodiments, the metal traces 34, 36, 38 may include a stack of titanium (0.06 µm), gold (0.04 µm), nickel (0.2 µm), copper (1.3 µm), nickel (0.2 µm) and gold (0.5 µm) formed in order on the submount 14.

Because the first, second and third metal traces 34, 36, 38 may be formed through metallization techniques on a support member 31, the metal traces may be spaced so that LED chips mounted thereon may be mounted in a relatively tight cluster. For example, the first and second metal traces 34, 36 may be separated by a gap of no more than about 0.2 mm, and in some embodiments may be separated by a gap of no more than about 0.1 mm. Likewise, the second and third metal traces 36, 38 may be separated by a gap of no more than about 0.2 mm, and in some embodiments may be separated by a gap of no more than about 0.1 mm. This may be contrasted with conventional lead frame mounted LED chips, which may be spaced apart by a gap of at least about 0.4 mm. Closer spacing of a cluster of LED chips in accordance with some embodiments of the invention may allow better mixing of light emitted from the cluster, which may provide more pleasing and/or uniform light emission from the package 50.

Figure 3:
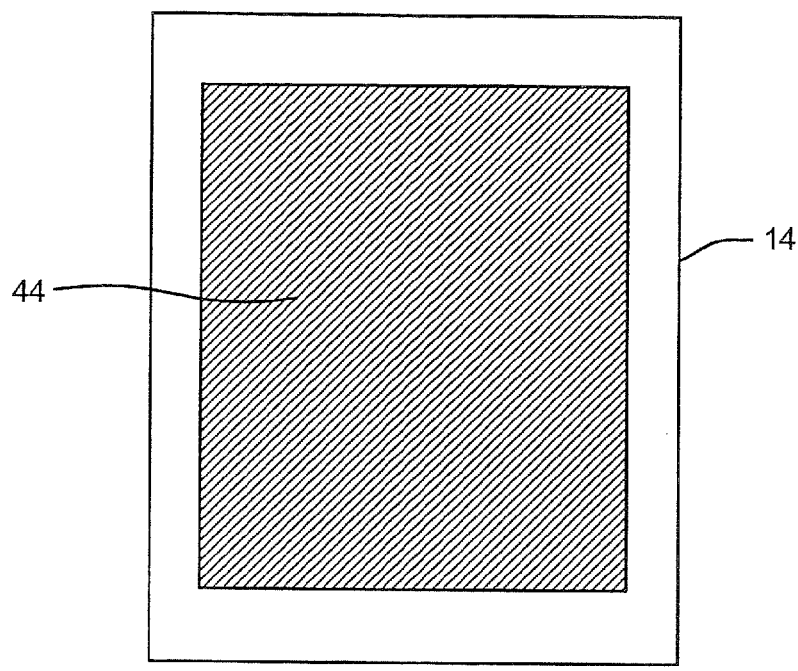
FIG. 3 is a bottom view of a submount for a package for a plurality of light emitting devices according to some embodiments of the invention.

FIG. 3 is a bottom view of a submount 14 for a package 50 for a plurality of light emitting devices according to some embodiments of the invention. As shown therein, a metal trace 44 may be formed on the bottom side of the submount 14. The metal trace 44 may be provided to allow the submount 14 to be soldered or otherwise attached to a surface of the body 10 of the package 50 (FIG. 1). The metal trace 44 on the bottom side of the submount 14 may include a layered metal stack including titanium, nickel and/or gold. In particular embodiments, the titanium layer may be formed to have a thickness of about 0.06 µm or greater. The nickel layer may be formed on the titanium layer and may have a thickness of about 5 µm or greater. The gold layer may be formed on the nickel layer and may have a thickness of about 0.6 µm or greater. In some embodiments, the metal trace 44 may include a metal stack including a first layer of titanium (0.06 μm), platinum (0.2 μm) and gold (0.5 μm) stacked in order on the submount 14, with a gold/tin solder layer having a thickness of about 3.0 μm+/−0.6 μm thereon.

Figure 4:
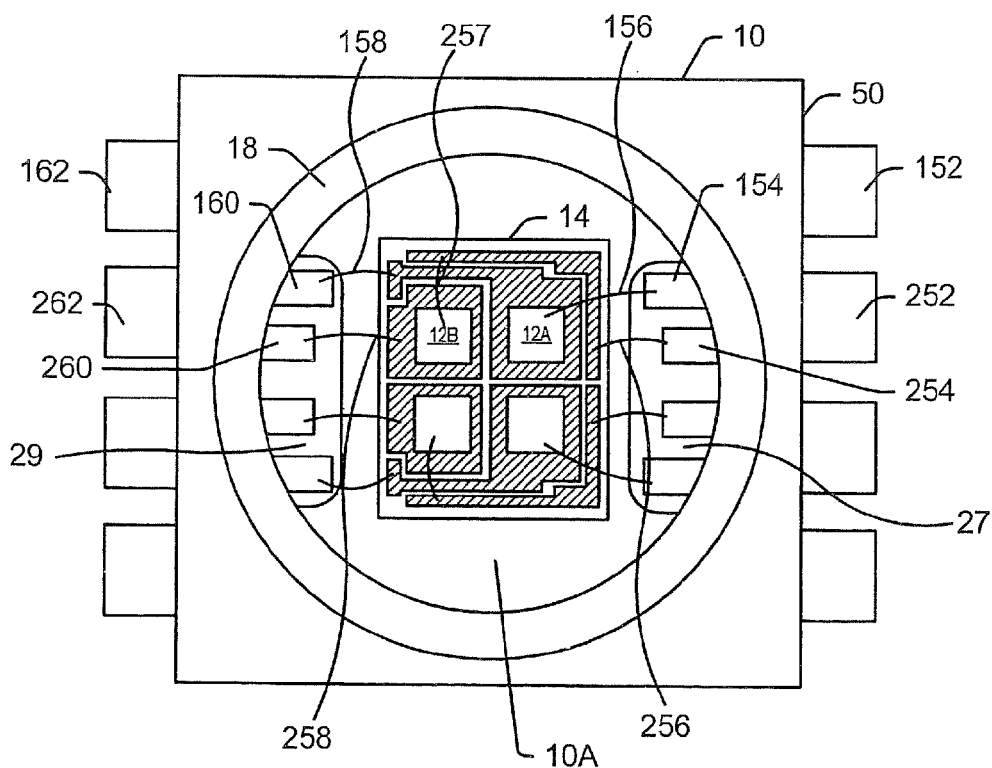
FIG. 4 is a top view of a package for a plurality of light emitting devices according to some embodiments of the invention.

FIG. 4 is a top view of a package 50 for a plurality of light emitting devices according to some embodiments of the invention. The package 50 may include a submount 14 as described in connection with FIGS. 2 and 3. Accordingly, the following discussion will refer to features illustrated in FIGS. 2-4.

As discussed above, the package 50 includes a body 10 having an upper surface 10 including a central region on which a submount 14 is positioned. Referring to FIGS. 2 and 4, the submount 14 includes respective pairs of first, second and third metal traces 34, 36 and 38. For simplicity, only a single one of the pairs of first, second and third metal traces 34, 36, 38 will be discussed. A first LED chip 12A is mounted on the die mounting region 36A of the second metal trace 36, and a second LED chip 12B is mounted on the die mounting region 38A of the third metal trace 38.

A reflector 18 may surround the central region of the body 10 and define an optical cavity above the LED chips 12A, 12B mounted on the submount 14.

The package 50 further includes a first external lead 152 that includes at least a portion 154 thereof exposed within a recess 27 in the body 10. The exposed portion 154 of the external lead 152 is coupled to an anode or cathode bondpad on the first LED chip 12A via a wirebond connection 156. The other bondpad (i.e. cathode or anode) of the first LED chip 12A is coupled to the die mounting region 36A of the second conductive trace 36. The extension region 36B of the second conductive trace is coupled to a second external lead 162 via a wirebond connection 158 to a portion 160 of the second external lead 162 that is exposed within a recess 29 in the body 10 of the package 50. Thus, the first external lead 152 and the second external lead 162 provide respective external anode/cathode contacts for the first LED chip 12A.

Similarly, a third external lead 252 includes at least a portion 254 thereof exposed within the recess 27. The exposed portion 254 of the third external lead 252 is connected to the first bonding region 34A of the first electrical trace 34 via a wirebond connection 256. The second bonding region 34B of the first electrical trace 34 is connected to an anode or cathode bondpad of the second LED 12B via a wirebond connection 257. The other (i.e. cathode or anode) bond pad of the second LED 12B is coupled to the die mounting region 38A of the third electrical trace 38, and the wirebonding region 38B of the third metal trace 38 is connected to a fourth external lead 262 via a wirebond connection 258 to a portion 260 of the fourth external lead 262 exposed in the recess 29.

In some embodiments, the first and third external leads 152, 252 on one side of the package 50 may include cathode contacts, while the second and fourth external leads 162, 262 on the other side of the package 50 may include anode contacts, or vice-versa.

Embodiments according to the invention may provide a number of features and/or benefits. For example, as may be seen in FIG. 4, wirebond connections in the package 50 may be kept relatively short, since wirebond connections may not have to cross over other wirebonds and/or other LED chips in the package 50. Thus, assembly of the package 50 may be simplified and/or reliability of the resulting packaged light emitting device may be enhanced. Furthermore, it will be appreciated that some external leads on one side of the package may be the same polarity type (i.e. anode or cathode). Thus, embodiments of the invention may be suitable for applications in which LED chips in adjacent packages 50 are connected in serial strings. By forming leads of one polarity type on the same side of the package 50, complicated and/or expensive multilevel interconnections may be avoided.

Furthermore, it will be appreciated that in some embodiments of the invention, the LED chips 12A, 12B may be isolated from one another, and may not share any common contacts, which may further facilitate the interconnection of LED chips of adjacently mounted packages 50 into a desired configuration, such as to form serial strings of LED chips. Furthermore, in embodiments in which the LED chips 12A, 12B are electrically isolated, it may be easier to independently control the current/brightness of individual LED chips of the package 50.

The foregoing description is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A package for a light emitting device, comprising:
a package body including a first side surface and a second side surface opposite the first side surface and a central region exposing a plurality of die attach pads;
a plurality of first electrical leads extending from the first side surface of the package body; and
a plurality of second electrical leads extending from the second side surface of the package body;
wherein respective ones of the first electrical leads are electrically connected to corresponding ones of the plurality of die attach pads;
the package further comprising an electrically insulating submount on the central region of the package body, wherein the plurality of die attach pads are on the electrically insulating submount;
a heatsink member that extends through the central region and contacts the electrically insulating submount;
a plurality of light emitting diode chips mounted on corresponding ones of the die attach pads; and
a plurality of wirebond connections from the second electrical leads directly to corresponding ones of the light emitting diode chips.

2. The package of claim 1, further comprising:
a reflector cup surrounding the central region of the package body.

3. The package of claim 1, further comprising a recess in the central region of the package body, the recess exposing at least portions of the plurality of first electrical leads.

4. The package of claim 3, wherein the recess comprises a first recess, the package further comprising a second recess in the central region of the package body, the second recess exposing at least portions of the plurality of second electrical leads.

5. The package of claim 1, further comprising:
a plurality of wirebond connections between the first electrical leads and corresponding ones of the die attach pads.

6. The package of claim 1, wherein the plurality of light emitting diode chips are electrically isolated from one another.

7. The package of claim 1, wherein the package body is molded to a leadframe including the plurality of first leads and the plurality of second leads.

8. The package of claim 1, wherein the package body includes respective upper and lower surfaces, wherein the heatsink member extends from the upper surface to the lower surface of the package body.

9. The package of claim 1, wherein the die attach pads comprise a first die attach pad including a first die mounting region proximate the first side surface of the package body and a second die attach pad including a second die mounting region proximate the second side surface of the body;
wherein the first die mounting region is between the second die mounting region and the first electrical leads; and
wherein the second die attach pad includes an extension region that extends away from the second die mounting region past the first die mounting region towards the first side surface of the package body.

10. The package of claim 1, wherein the plurality of light emitting diode chips comprise first electrical contacts in contact with the submount and second electrical contacts opposite the submount, wherein the plurality of wirebond connections between the second electrical leads and the corresponding ones of the light emitting diode chips are made to the second electrical contacts opposite the submount.

* * * * *